US006987613B2

(12) United States Patent
Pocius et al.

(10) Patent No.: US 6,987,613 B2
(45) Date of Patent: Jan. 17, 2006

(54) FORMING AN OPTICAL ELEMENT ON THE SURFACE OF A LIGHT EMITTING DEVICE FOR IMPROVED LIGHT EXTRACTION

(75) Inventors: Douglas W. Pocius, Sunnyvale, CA (US); Michael D. Camras, Sunnyvale, CA (US); Gloria E. Hofler, Sunnyvale, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 627 days.

(21) Appl. No.: 09/823,841

(22) Filed: Mar. 30, 2001

(65) Prior Publication Data

US 2002/0141006 A1 Oct. 3, 2002

(51) Int. Cl.
 *G02B 27/44* (2006.01)

(52) U.S. Cl. .......................................... 359/565; 257/98
(58) Field of Classification Search .................. 359/15, 359/19, 565, 742; 385/14; 257/88, 93, 95, 257/98; 372/99
See application file for complete search history.

(56) References Cited

U.S. PATENT DOCUMENTS

| 3,769,536 A | 10/1973 | Antypas et al. |
| 4,391,683 A | 7/1983 | Buckley et al. .......... 204/129.3 |
| 4,675,058 A | 6/1987 | Plaster |

(Continued)

FOREIGN PATENT DOCUMENTS

| EP | 0926744 | 6/1999 |
| JP | 09153645 | 6/1997 |
| JP | 09167515 | 6/1997 |

(Continued)

OTHER PUBLICATIONS

WO 02/37578 A1, Translation from German, World Organization of Intellectual Property.
Joshua Israelsohn, *Switching the Light Fantastic*, EDN, Oct. 26, 2000, at 113.
WO 00/70687, Translation from German, World Organization of Intellectual Property.
WO 006900, Translation from German, World Organization of Intellectual Property.

(Continued)

*Primary Examiner*—Mark A. Robinson
*Assistant Examiner*—Alessandro Amari
(74) *Attorney, Agent, or Firm*—Patent Law Group LLP

(57) ABSTRACT

Provided is a light emitting device including a Fresnel lens and/or a holographic diffuser formed on a surface of a semiconductor light emitter for improved light extraction, and a method for forming such light emitting device. Also provided is a light emitting device including an optical element stamped on a surface for improved light extraction and the stamping method used to form such device. An optical element formed on the surface of a semiconductor light emitter reduces reflective loss and loss due to total internal reflection, thereby improving light extraction efficiency. A Fresnel lens or a holographic diffuser may be formed on a surface by wet chemical etching or dry etching techniques, such as plasma etching, reactive ion etching, and chemically-assisted ion beam etching, optionally in conjunction with a lithographic technique. In addition, a Fresnel lens or a holographic diffuser may be milled, scribed, or ablated into the surface. Stamping, an alternative method for forming an optical element, can also be used to form a Fresnel lens or a holographic diffuser on the surface of a semiconductor light emitter. Stamping includes pressing a stamping block against the surface of a light emitting diode. The stamping block has a shape and pattern that are the inverse of the desired optical element. Optionally, stamping can be done before, after, or concurrently with wafer-bonding. Alternatively, a material can be stamped and later bonded to the semiconductor light emitter.

53 Claims, 8 Drawing Sheets

U.S. PATENT DOCUMENTS

| | | | |
|---|---|---|---|
| 4,689,652 A | * 8/1987 | Shimada et al. | 257/432 |
| 4,815,084 A | * 3/1989 | Scifres et al. | 372/46 |
| 4,983,009 A | 1/1991 | Musk | |
| 4,988,579 A | * 1/1991 | Tomomura et al. | 257/78 |
| 5,040,868 A | 8/1991 | Waitl et al. | 358/33 |
| 5,055,892 A | 10/1991 | Gardner et al. | 357/17 |
| 5,130,531 A | * 7/1992 | Ito et al. | 250/216 |
| 5,132,430 A | * 7/1992 | Gaudiana et al. | 548/444 |
| 5,141,677 A | * 8/1992 | Fogarty | 264/1.36 |
| 5,255,171 A | 10/1993 | Clark | |
| 5,317,170 A | * 5/1994 | Paoli | 257/88 |
| 5,376,580 A | * 12/1994 | Kish et al. | 438/26 |
| 5,502,316 A | 3/1996 | Kish et al. | |
| 5,528,057 A | * 6/1996 | Yanagase et al. | 257/96 |
| 5,553,089 A | 9/1996 | Seki et al. | |
| 5,661,316 A | 8/1997 | Kish et al. | |
| 5,698,452 A | 12/1997 | Goossen | |
| 5,724,376 A | 3/1998 | Kish, Jr. et al. | |
| 5,779,924 A | 7/1998 | Krames et al. | |
| 5,793,062 A | 8/1998 | Kish, Jr. et al. | |
| 5,837,561 A | 11/1998 | Kish, Jr. et al. | |
| 5,875,205 A | * 2/1999 | Spaeth et al. | 372/50 |
| 5,898,185 A | 4/1999 | Bojarczuk, Jr. et al. | |
| 5,917,201 A | 6/1999 | Ming-Jiunn et al. | |
| 5,925,898 A | 7/1999 | Späth | 257/98 |
| 5,966,399 A | * 10/1999 | Jiang et al. | 372/96 |
| 6,015,719 A | 1/2000 | Kish, Jr. et al. | |
| 6,075,627 A | * 6/2000 | Feldman et al. | 359/9 |
| 6,091,020 A | 7/2000 | Fairbanks et al. | |
| 6,091,694 A | 7/2000 | Späth | 369/112 |
| 6,155,699 A | 12/2000 | Miller et al. | 362/293 |
| 6,165,911 A | * 12/2000 | Calveley | 438/754 |
| 6,214,733 B1 | 4/2001 | Sickmiller | |
| 6,233,267 B1 | * 5/2001 | Nurmikko et al. | 372/46 |
| 6,412,971 B1 | 7/2002 | Wojnarowski et al. | |
| 6,429,462 B1 | 8/2002 | Shveykin | |
| 6,469,785 B1 | * 10/2002 | Duveneck et al. | 356/244 |
| 6,483,196 B1 | 11/2002 | Wojnarowski et al. | |
| 6,495,862 B1 | 12/2002 | Okazaki et al. | |
| 2002/0030194 A1 | 3/2002 | Camras et al. | |
| 2002/0141006 A1 | 10/2002 | Pocius et al. | |

FOREIGN PATENT DOCUMENTS

| | | |
|---|---|---|
| WO | WO 00/69000 | 11/2000 |
| WO | WO 00/70687 | 11/2000 |
| WO | WO01/80322 A2 | 4/2001 |
| WO | WO01/80322 A3 | 4/2001 |
| WO | WO 01/41219 A1 | 6/2001 |
| WO | WO 01/41225 A2 | 6/2001 |
| WO | WO02/37578 A1 | 5/2002 |

OTHER PUBLICATIONS

WO 01/80322 A2, Translation from German, World Organization of Intellectual Property.

"Bulk Measurement", Sairon Technology, Inc., pp. 1–3.

Thomas R. Anthony, "Dielectric isolation of silicon by anodic bonding", J. Appl. Phys. vol. 58, No. 3, Aug. 1, 1985, pp. 1240–1247.

Chui et al., "High–Efficiency AlGaInP Light–Emitting Diodes", Semiconductor And Semimetals, vol. 64, Chapter 2, pp. 49–128.

Babi et al., "Room–Temperature Continuous–Wave Operation of 1.54-$\mu$m Vertical–Cavity Lasers", IEEE Photonics Technology Letters, vol. 7, No. 11, Nov. 1995, pp. 1225–1227.

Chua et al., "Dielectrically–Bonded Long Wavelength Vertical Cavity Laser on GaAs Substrates Using Strain–Compensated Multiple Quantum Wells", IEEE Photonics Technology Letters, vol. 6, No. 12, Dec. 1994, pp. 1400–1402.

Fischer et al., "Highly Refractive Glasses to Improve Electroluminescent Diode Efficiencies", Journal of the Electrochemical Society: Solid State Science, Dec. 1969, pp. 1718–1722.

Carr, "Photometric Figures of Merit for Semiconductor Luminescent Sources Operating in Spontaneous Mode", Infrared Physics, 1966, vol. 6, pp. 1–19.

Mary T. Strzelecki et al., "Low Temperature Bonding of Glasses and Glass Ceramics", 8 pages.

Robert D. Simpson et al., "Hybrid Glass Structures For Telecommunication Applications", 8 pages.

Joseph S. Hayden, Passive and Active Characterization of Hybrid Glass Substrates for Telecommunication Applications, 8 pages.

J.W. Osenbach, et al., Low Cost/High Volume Laser Modules Using Silicon Optical Bench Technology, 1998 Electronic Components and Technology Conference, pp. 581–587.

Aluminum Oxide, Al2O3 For Optical Coating, , CERAC, Inc. Technical Publications, pp. 1–4

* cited by examiner

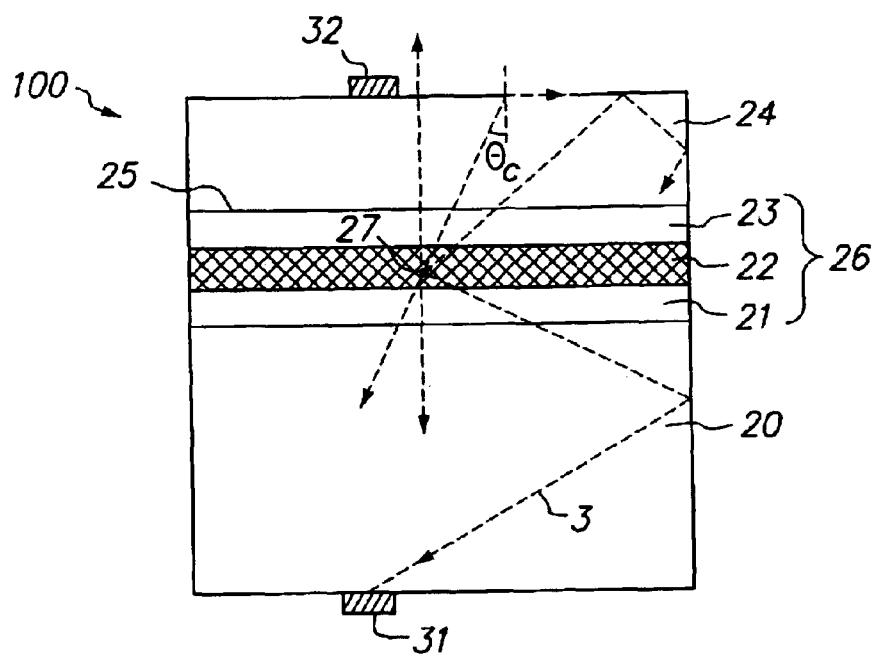
FIG. 1 (PRIOR ART)
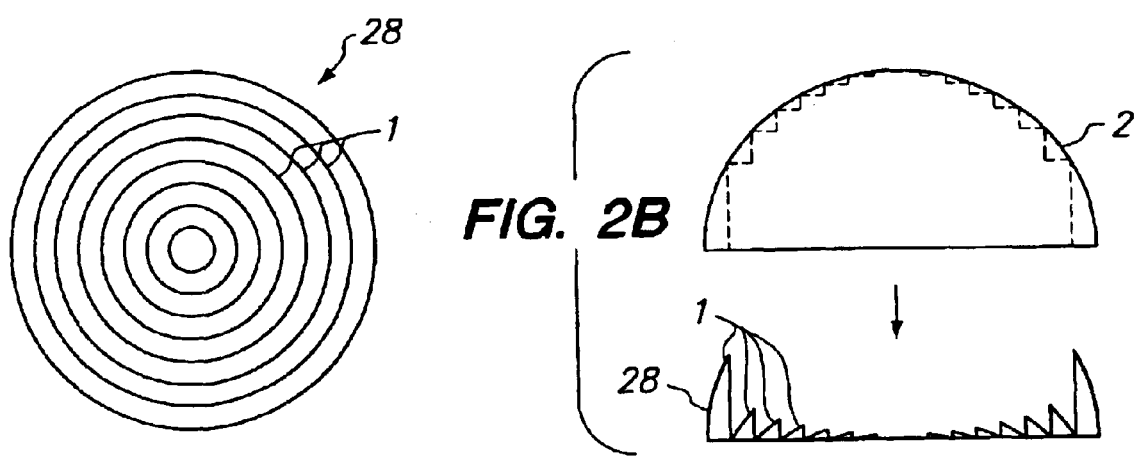
FIG. 2A
FIG. 2B

FORMING AN OPTICAL ELEMENT ON THE SURFACE OF A LIGHT EMITTING DEVICE FOR IMPROVED LIGHT EXTRACTION

BACKGROUND

1. Technical Field

The invention relates generally to light-emitting devices and more particularly to light emitting devices with improved light extraction.

2. Description of the Prior Art

FIG. 1 depicts a prior art semiconductor light emitter 100 consisting of substrate 20, multi-layered structure 26, and top layer 24. Semiconductor light emitter 100 may be, for example, a light emitting diode ("LED") or a semiconductor laser. An LED is a p-n junction device that is designed to convert an incoming flow of electric energy into an outgoing flow of electromagnetic radiation. An LED may emit electromagnetic radiation in ultraviolet, visible, or infrared regions of the electromagnetic spectrum. The visible LEDs are commonly used for illumination and displays, and also have applications as an information link between electronic instruments and their users. The infrared LEDs are useful in opto-isolators and optical-fiber communications. A semiconductor laser is constructed in a manner similar to an LED.

Multi-layered structure 26 includes but is not limited to lower confining layer 21, upper confining layer 23, and active layer 22 where photons are emitted. Upper confining layer 23 may include top layer 24. Where semiconductor light emitter 100 does not have a separate top layer 24, confining layer 23 is the top layer.

Confining layers 21, 23 and active layer 22 of multi-layered structure 26 are typically formed from III-V semiconductors, III-nitride semiconductors, and II-VI semiconductors. Top layer 24, which may be epitaxially grown on upper confining layer 23, is also typically a III-V semiconductor, III-nitride semiconductor, II-VI semiconductor, or an alloy thereof. However, top layer 24 can have a semiconductor alloy composition that is different from the material forming confining layer 21 or confining layer 23. It is preferable that top layer 24 is made of a material that has a bandgap greater than that of active layer 22 so as to be transparent to the light emitted by active layer 22. As used herein, the term "transparent" indicates that an optical element so described transmits light at the emission wavelengths of the particular semiconductor light emitter with less than about 50%, and preferably less than about 10%, single pass loss due to absorption or scattering. Top layer 24 can be a transparent substrate (a superstrate) wafer-bonded to the upper confining layer 23. Top layer 24 may also be the substrate on which the epitaxial layers have been grown.

Lower confining layer 21 and upper confining layer 23 are electrically coupled to active layer 22 and to contact 31 and contact 32. Typically, one confining layer is doped with donors to make an n-type confining layer, and the other confining layer is doped with acceptors to make a p-type confining layer. Thus, upon the application of suitable voltage across contacts 31 and 32, electrons from the n-type confining layer and the holes from the p-type confining layer combine in active layer 22 and emit light isotropically. Further details on semiconductor light emitter 100 as an LED are provided in U.S. Pat. No. 6,133,589 to Michael R. Krames, et. al. entitled "AlGaInN-based LED Having Thick Epitaxial Layer for Improved Light Extraction," and U.S. Pat. No. 5,793,062 and U.S. Pat. No. 6,015,719 to Fred A. Kish, Jr. et. al., both of which are entitled "Transparent Substrate Light Emitting Diode with Directed Light Output." All of these patents are herein incorporated by reference.

Semiconductor light emitter 100 may be LED 100. A problem with LEDs is a low light extraction efficiency. The low light extraction efficiency is caused by only a fraction (e.g., approximately 30% for an AlGaAs LED with a transparent substrate) of the light energy emitted by active layer 22 managing to escape LED 100. As a consequence of the low light extraction efficiency, only a fraction of the consumed electrical input results in useful externally observable light. Light extraction efficiency is defined as the ratio of the number of photons that escape the LED to the number of photons generated in the LED.

Path 3 of FIG. 1 shows the direction of a photon emitted from point source 27 of active layer 22. As shown by path 3, the absorptive property of contacts 31, 32 contribute to the low light extraction. The photon traveling along path 3 reflects off the inner surface of LED 100 and becomes absorbed by contact 31. Contacts 31 and 32 may be formed from metals such as gold, nickel, aluminum, titanium, chromium, platinum, palladium, and mixtures or alloys thereof.

Loss mechanisms responsible for the low light extraction efficiency include absorption within the semiconductor light emitter, reflection loss when light passes from one type of material to another material that has a different index of refraction, and total internal reflection followed by absorption within the light emitting device. Total internal reflection, however, prevents photons from escaping semiconductor light emitter 100 only when photons emitted by active layer 22 reach the interface of light emitting device 100 and the surrounding material at an angle greater than the critical angle ($\theta_c$). Critical angle (shown in FIG. 1 as "$\theta_c$"), as it relates to the present embodiment, is defined as $\theta_c = \arcsin(n_{surrounding}/n_{LED})$ where $n_{surrounding}$ and $N_{LED}$ indicate the refractive index of the material surrounding the light emitting device and the refractive index of the light emitting device, respectively. An LED is frequently encapsulated in epoxy, whose index of refraction ($n_{epoxy}$) is around 1.5. For an LED made of one of the III-V semiconductor materials mentioned above, the index of refraction ranges from about 2.4 to about 4.1 at the typical LED emission wavelengths. Taking an average refractive index ($n_{LED}$) to be approximately 3.5, a typical value of $\theta_c$ is approximately 25°. Thus, a photon emitted from a point source 27 in active layer 22 can escape LED 100 from any surface through an "escape cone" with a half-angle of 25°. Photons that strike the interface between LED 100 and the surrounding material outside the escape cone may be subjected to a series of internal reflections and become absorbed by, for example, the semiconductor layers (including active layer 22) or contacts 31 and 32. Thus, many of the photons that strike a surface at an angle greater than 25° to an axis normal to the surface do not escape the LED on the first pass. An LED with a higher light extraction efficiency that allows more of the emitted photons to escape the LED is needed.

SUMMARY

The present invention may be used to achieve improved light extraction of semiconductor light emitters, and to direct, focus, and diffuse light to obtain a desired radiation pattern. The present invention includes a semiconductor light emitter shaped into one or more optical elements, such as Fresnel lenses and holographic diffusers, and a method of stamping a surface of a semiconductor light emitter into an optical element. One or more surfaces of semiconductor light emitter 100 may be formed into Fresnel lenses or holographic diffusers. A surface in the shape of a Fresnel lens is desirable because a Fresnel lens allows more of the photons emitted from active layer 22 to strike the surface of semiconductor light emitter 100 at near normal incidence, minimizing the loss of light due to total internal reflection. Furthermore, a surface of a semiconductor light emitter that is shaped into a Fresnel lens reduces the reflective loss of light that is usually caused by the lens material having a different index of refraction than the material that constitutes the semiconductor light emitter. The Fresnel lens and/or holographic diffuser may be formed by etching, perhaps in conjunction with lithographic techniques including but not limited to photolithography, electron beam lithography, ion beam lithography, X-ray lithography, or holographic lithography. Wet chemical etching or dry etching techniques such as plasma etching, reactive ion etching (RIE), and chemically-assisted ion beam etching (CAIBE) may be used. Also, the Fresnel lens may be milled into the surface using ion beam milling or focused ion beam milling (FIB), ablated into the surface with a scanning electron or a laser beam, or it can be mechanically machined into the surface of semiconductor light emitter 100 by milling or scribing.

Stamping is an alternative way of forming an optical element on the surface of a light emitting device. The stamping process is carried out at a temperature above the ductile transition point of the semiconductor material that is to be stamped. In one embodiment, stamping is integrated with wafer-bonding process. As a wafer-bonding process is commonly executed in an environment with temperature in the vicinity of 600° C. or higher, the stamping process can be readily integrated with the wafer-bonding process to maximize production efficiency. A wafer-bonding process entails removing the original absorptive substrate that was used as a template to grow epitaxial layers of the desired quality and replacing it with a transparent substrate to improve light extraction. Optionally, at the time the transparent substrate is bonded to a first surface of semiconductor light emitter 100, a stamping block with a shape or a pattern that is the inverse of the shape or the pattern of the desired optical element can be pressed against a second surface of semiconductor light emitter 100, a surface of the transparent substrate, or both surfaces. When the pressure is released, a light emitting device having a surface that is shaped into the desired optical element is formed. The stamping block used for stamping usually has a higher melting point temperature than the process temperature that is applied during the formation of the optical element. Suitable materials for stamping block include but are not limited to molybdenum alloys, graphite, silicon carbide, and sapphire. The optical element may be formed on one or more surfaces of semiconductor light emitter. Although the stamping process is an independent process, it may optionally be used before, after, or concurrently with the wafer-bonding process. Alternatively, it may be used to stamp a material that is later bonded to semiconductor light emitter 100.

The present invention can be easily adapted to suit different applications. For example, the optical element can be made to collimate the light for illumination, or to focus the light into optical fibers. Furthermore, any surface of an LED can be shaped into one or more optical elements, and more than one surface may be shaped into one or more Fresnel lenses. A reflective coating can be used to direct the collimated or focused light in the desired direction. Diode arrays, which are made by forming multiple optical elements on semiconductor light emitter 100, may be used for high-power applications.

The effectiveness of the present invention can be enhanced by increasing the proportion of the photons that are emitted toward a preselected portion of the optical element. For example, a confined-emission spot LED may be made to emit an increased proportion of the emitted photons toward the center of a Fresnel lens because the photons that reach the edge of a Fresnel lens benefit less from the presence of the Fresnel lens. Methods that can confine photon emission to selected areas of the active layer include ion implantation, diffusion, oxide passivation, selective area growth, and selective area bonding. Alternatively, the outer edges of semiconductor light emitter 100 or active layer 22 may be etched away. Etching away the outer edges may produce a light emitting device with beveled sides.

BRIEF DESCRIPTION OF THE DRAWINGS

The figures are not drawn to scale.

FIG. 1 is a schematic diagram of a prior art semiconductor light emitter.

FIG. 2A is a plain view of a Fresnel lens with uniformly spaced grooves of different heights that is designed to converge light.

FIG. 2B depicts cross-sectional views of a converging lens and the Fresnel lens of FIG. 2A.

DETAILED DESCRIPTION OF THE EMBODIMENTS

As used herein, the "extraction surface" refers to the surface of a light emitting device intended to be the light output surface. A light emitting device may have more than one extraction surface. For convenience of illustration, the figures show the extraction surface as the top surface. The light emitting device may be an LED. The light generating portions of the LEDs described herein may be conventional active layers of an LED. A "light emitting device," as used herein, includes a device including at least one semiconductor light emitter 100. The present invention includes both stamping the surface of a light emitting device into an optical element and forming a Fresnel lens or a holographic diffuser on the surface of a light emitting device using any method including stamping. Although the present invention also includes a holographic diffuser formed on the surface of a light emitting device, the examples and descriptions refer mainly to Fresnel lens for clarity of illustration. Also for clarity of illustration, semiconductor light emitter 100 is described as light emitting diode 100. Elements in the various figures having the same numerals may be identical.

Figure 3A:
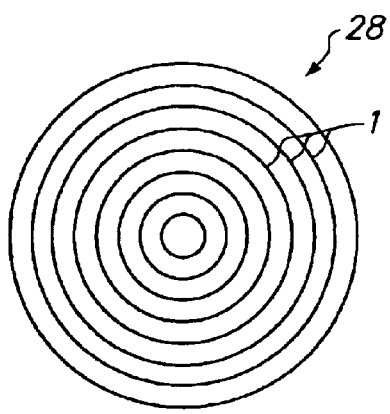
FIG. 3A is a plain view of a Fresnel lens with uniformly spaced grooves of different heights that is designed to diverge light.
Figure 3B:
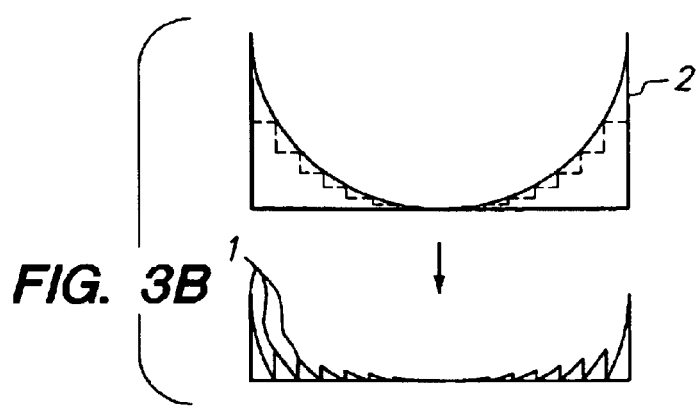
FIG. 3B depicts cross-sectional views of a diverging lens and the Fresnel lens of FIG. 3A.
Figure 4A:
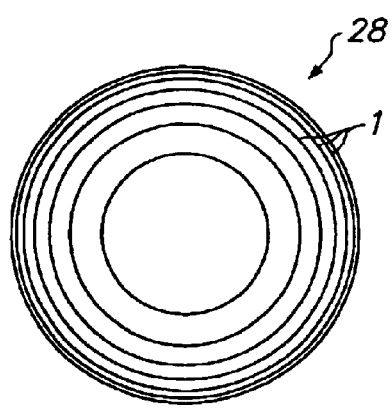
FIG. 4A is a plain view of a converging Fresnel lens having grooves of uniform height wherein the spacing between the grooves is a function of the distance from the center of the lens.
Figure 4B:
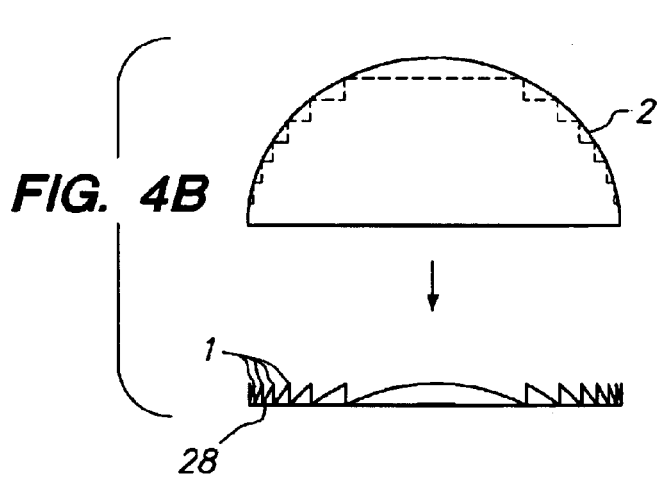
FIG. 4B depicts cross-sectional views of a converging lens and the Fresnel lens of FIG. 4A.
Figure 5A:
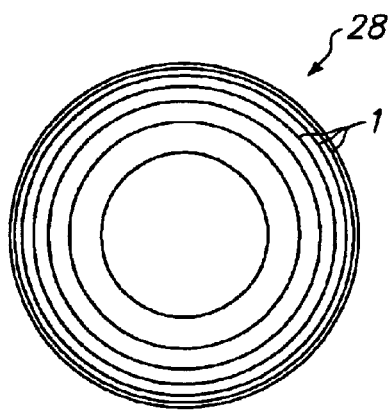
FIG. 5A is a plain view of a diverging Fresnel lens having grooves of uniform height wherein the spacing between the grooves is a function of the distance from the center of the lens.
Figure 5B:
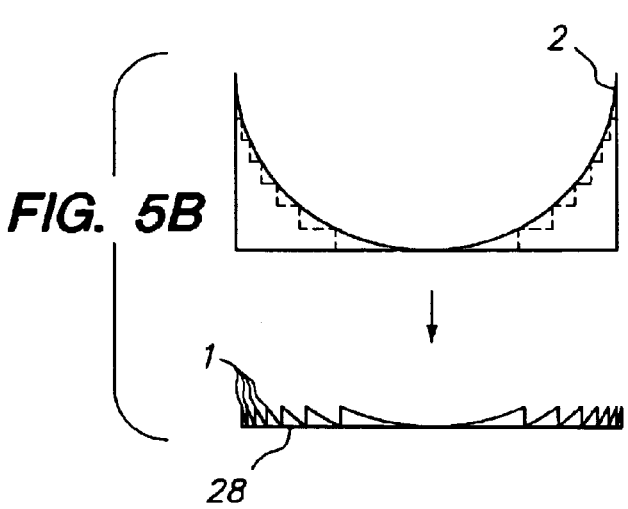
FIG. 5B depicts cross-sectional views of a diverging lens and the Fresnel lens of FIG. 5A.
Figure 6:
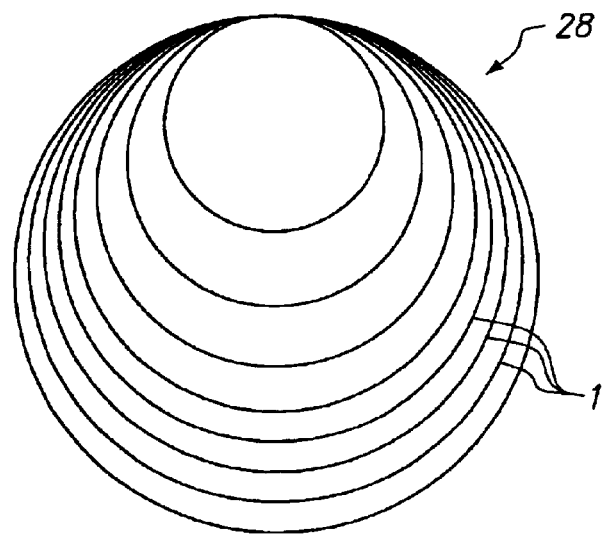
FIG. 6A is a plain view of a Fresnel lens having grooves that are not concentric around the center of the lens.

As shown in FIG. 2A, FIG. 2B, FIG. 3A, FIG. 3B, FIG. 4A, FIG. 4B, FIG. 5A, and FIG. 5B, Fresnel lens 28 consists of a series of concentric grooves 1 formed on a surface, in contrast to the single curved surface of a converging lens. Grooves 1 have curved or angled surfaces that act as refracting surfaces. Grooves 1 may be uniformly spaced, as shown in FIG. 2A and FIG. 3A. As FIG. 2B and FIG. 3B show, when Fresnel lens 28 has uniformly spaced grooves, the height of the grooves may be varied in order to produce Fresnel lens 28 of the desired focal length. The shape of the grooves may be varied to, for example, converge the light rays as in FIG. 2B or to diverge the light rays as in FIG. 3B. Alternatively, when Fresnel lens 28 has grooves of equal height as in FIGS. 4B and 5B, the space between grooves 1 may be adjusted to produce Fresnel lens 28 of the desired focal length. Fresnel lens 28 shown in FIG. 4A and FIG. 5A has grooves that are more closely spaced as they get closer to the edge of the lens. FIG. 4B and FIG. 5B illustrate that the shape of grooves 1 can be adjusted to direct the light in a desired manner. The Fresnel lens of FIG. 4B makes the light rays converge while the Fresnel lens of FIG. 5B makes the light rays diverge. Grooves 1 of Fresnel lens 28 do not need to be concentrically arranged around the center of the lens. FIG. 6, for example, depicts Fresnel lens 28 having grooves 1 that are not concentric. The Fresnel lens may be based on an aspherical model or a spherical model. Furthermore, the surface on which the Fresnel lens is formed need not be flat. A Fresnel lens may be formed on LEDs of any shape, for example rectangular LEDs, elliptical LEDs, pyramidal LEDs, and cylindrical LEDs. Optionally, the tall grooves near the edge of Fresnel lens 28 in FIG. 2B and FIG. 3B or the closely-spaced grooves near the edge of the Fresnel lens 28 shown in FIG. 4B and FIG. 5B may be omitted when Fresnel lens 28 is formed on a semiconductor light emitting device.

FIG. 2B, FIG. 3B, FIG. 4B, and FIG. 5B compare the thickness of conventional converging and diverging lens 2 to Fresnel lens 28. As shown, Fresnel lens 28 tends to be thinner than conventional lens 2 having a comparable focal length. Since the lens material (i.e., the semiconductor material) inherently absorbs some light, the thinner Fresnel lens 28 is preferable to the thicker conventional lens 2 for LED applications.

Figure 7A:
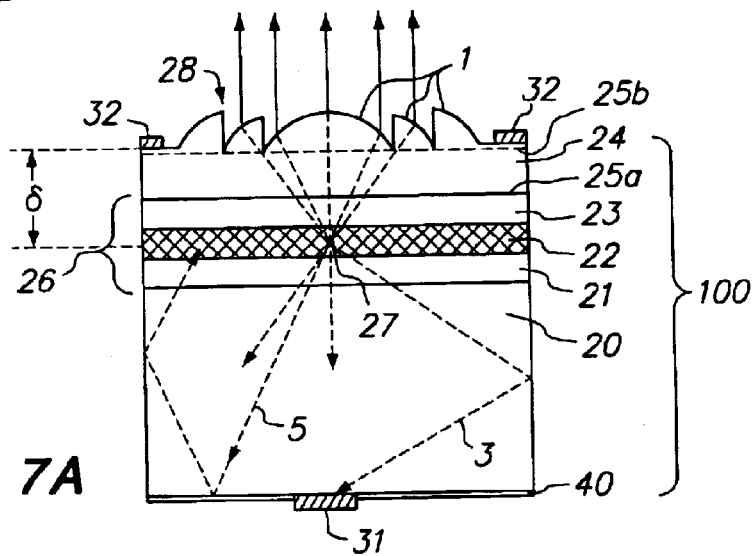
FIG. 7A is a schematic diagram of a light emitting device having a light-collimating Fresnel lens formed on one extraction surface in accordance with the present invention.

FIG. 7A illustrates a light emitting device with optical element 28, shown as Fresnel lens 28, formed on a surface. Photons are emitted isotropically from point source 27 located in active layer 22. Fresnel lens 28 formed on the extraction surface of semiconductor light emitter 100 helps extract light from semiconductor light emitter 100 because more of the emitted photons strike the extraction surface at near-normal incidence if the extraction surface has grooves 1 than when the extraction surface is flat. Photons that strike a surface at near-normal incidence are not subjected to total internal reflection, and are therefore more likely to be extracted. Coating the bottom surface with reflective material 40 helps reduce light loss due to reflection losses or absorption at the bottom surface. Photons traveling along path 5 may still experience attenuation and eventual absorption. A Fresnel lens on the bottom surface can be used to extract photons traveling along path 5, as will be discussed later.

Figure 7B:
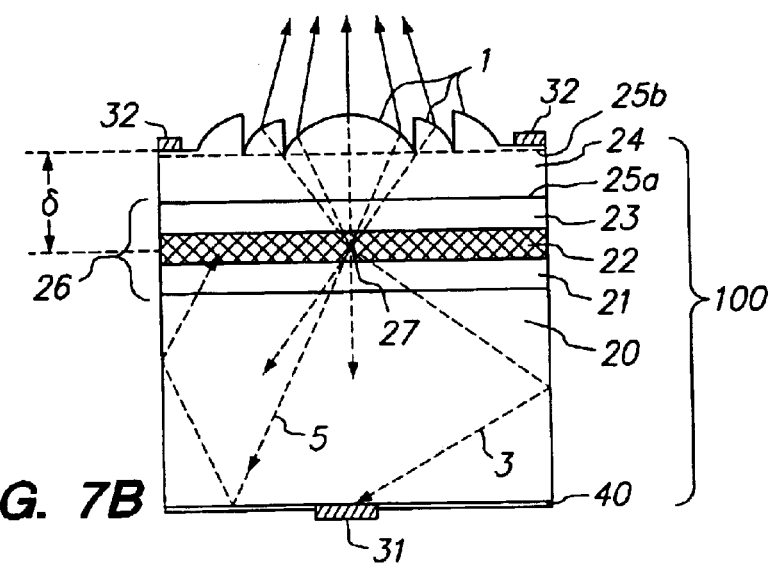
FIG. 7B is a schematic diagram of a light emitting device having a light-focusing Fresnel lens formed on the extraction surface in accordance with the present invention.
Figure 7C:
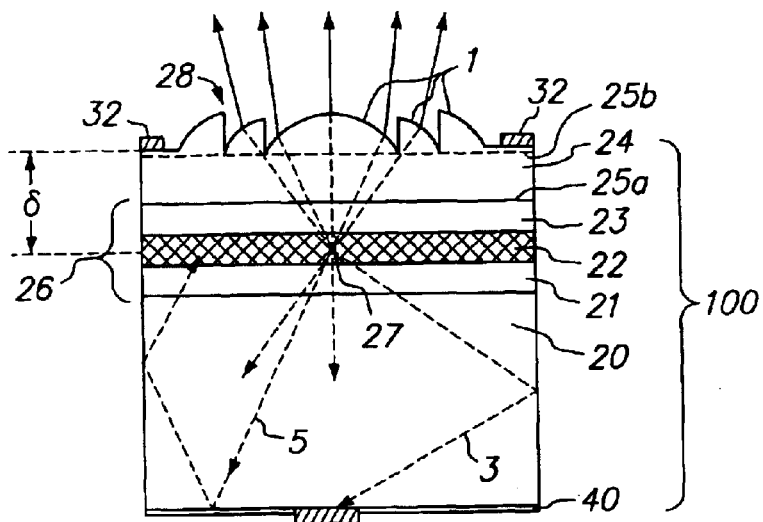
FIG. 7C is a schematic diagram of a light emitting device having a light-diverging Fresnel lens formed on the extraction surface in accordance with the present invention.

FIG. 7A, FIG. 7B, and FIG. 7C together illustrate how the radiation pattern of a light emitting device can be manipulated through distance δ as well as the height, the groove spacing, and the focal length of Fresnel lens 28. Distance δ refers to the distance between active layer 22 and Fresnel lens 28. Distance δ, the horizontal placement of Fresnel lens 28, and the focal length of Fresnel lens 28 affect the radiation pattern of the light emitting device. When a light source is placed substantially near the focal point of a converging lens, the light rays that emerge are substantially collimated, as in FIG. 7A. By varying distance δ, light rays can be substantially focused as in FIG. 7B or diverged as in FIG. 7C. A light-focusing embodiment of the sort depicted in FIG. 7B can be used for fiber-optic applications.

A Fresnel lens or a holographic diffuser may be formed on a surface through a number of methods. The "carving method" entails first forming top layer 24 on, for example, the multi-layered structure 26, then shaping top layer 24 into the desired pattern by wet chemical etching or dry etching techniques such as plasma etching, reactive ion etching, or chemically-assisted ion beam etching (CAIBE). Optionally, a lithographic technique may be used in conjunction with the etching technique. The lithographic technique includes but is not limited to photolithography, electron beam lithography, ion beam lithography, X-ray lithography, and holographic lithography. Additionally, the desired optical element may be milled into the surface using ion beam milling or focused ion beam milling, ablated into the surface with a scanning electron or a laser beam, machined into the surface by electrical discharged machining (EDM), or mechanically machined into the surface of semiconductor light emitter 100 by milling or scribing.

The Fresnel lens or the holographic diffuser may also be formed using a bonding method. The bonding method entails bonding an optical element to multi-layered structure 26, typically with a bonding material. Before placing the Fresnel lens or the holographic diffuser on top of a semiconductor light emitter, the bonding material is first deposited on top of multi-layered structure 26. The bonding material may be deposited using a conventional deposition technique, such as spinning, sputtering, evaporation, chemical vapor deposition, metal-organic chemical vapor deposition, vapor phase epitaxy, liquid phase epitaxy, or molecular beam epitaxy. In the embodiment shown in FIG. 7A, which does not show the bonding material, the bonding material may lie at interface 25a between optical element 28 and upper conductive layer 23. If a light emitting device includes top layer 24, however, the bonding material may lie at interface 25b between optical element 28 and top layer 24.

When using the bonding method, it is preferred that the bonding material have an index of refraction ($n_{bonding}$) that closely matches either $n_{LED}$ or $n_{lens}$ (if $n_{LED}$ and $n_{lens}$ are different) so as to minimize the reflective light loss at interface 25a or 25b (FIG. 7A). The bonding material can have a similar coefficient of thermal expansion to both the semiconductor light emitter and Fresnel lens 28 so as to minimize the strain when the device is subjected to temperature change. Furthermore, the bonding material may be transparent to the wavelength of the light emitted by active layer 22. For example, the lens material and the bonding material may be, but is not limited to, one of the following: a high index optical glass; III-V semiconductors such as GaP (n~3.3 at 600 nm), InGaP (n~3.7 at 600 nm), GaAs (n~3.4 at 500 nm), GaN (n~2.4 at 500 nm); II-VI semiconductors such as ZnS (n~2.4 at 500 nm), ZnSe (n~2.6 at 500 nm), CdS (n~2.6 at 500 nm), CdTe (n~2.7 at 500 nm), ZnTe (n~3.1 at 500 nm); group IV semiconductors and compounds such as Si (n~3.5 at 500 nm) and Ge (n~4.1 at 500 nm); high-index organic semiconductors; high index organic compounds; and mixtures or alloys thereof. If $n_{bonding}$ is different from $n_{LED}$ and $n_{lens}$, reflective light loss would occur at both the interface of the semiconductor light emitter and the bonding material and the interface of the bonding material and Fresnel lens 28.

Lens material may be selected so that the lens and the multi-layered structure can be bonded by being pressed together in a high temperature environment without a bonding material. When no bonding material is used, there is a lower possibility of additional light loss due to the bonding material's index of refraction being different from $n_{LED}$. Further details on bonding are discussed in a separate U.S. patent application titled "LED with Improved Light Extraction Efficiency," Ser. No. 09/660,317, which is incorporated herein by reference.

Figure 8A:
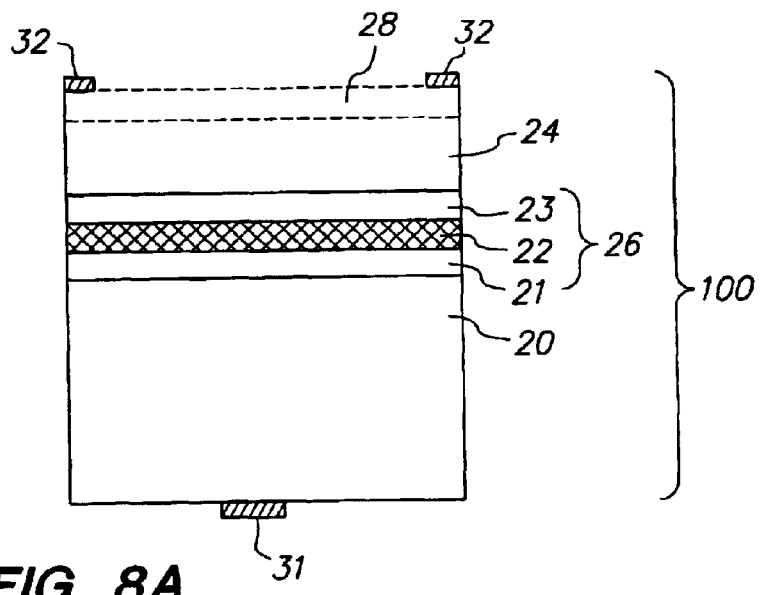
FIG. 8A is a schematic diagram of a light emitting device having a surface shaped into an optical element.
Figure 8B:
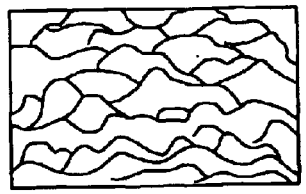
FIG. 8B is a plain view of the surface of a holographic diffuser that may be used according to the present invention.

Yet another method that can be used to make the present invention is the stamping method. FIG. 8A shows a light emitting device including semiconductor light emitter 100 and a surface shaped into optical element 28. FIG. 8B shows a plain view of a holographic diffuser that may be used as optical element 28 in FIG. 8A. The surface of a holographic diffuser includes random, nonperiodic microlenslets. Holographic diffusers diverge light and eliminate noise and color diffraction. Although FIG. 8B shows optical element 28 as a holographic diffuser, optical element 28 may be any other optical element, such as a conventional lens, a Fresnel lens, or a reflector.

Figure 9:
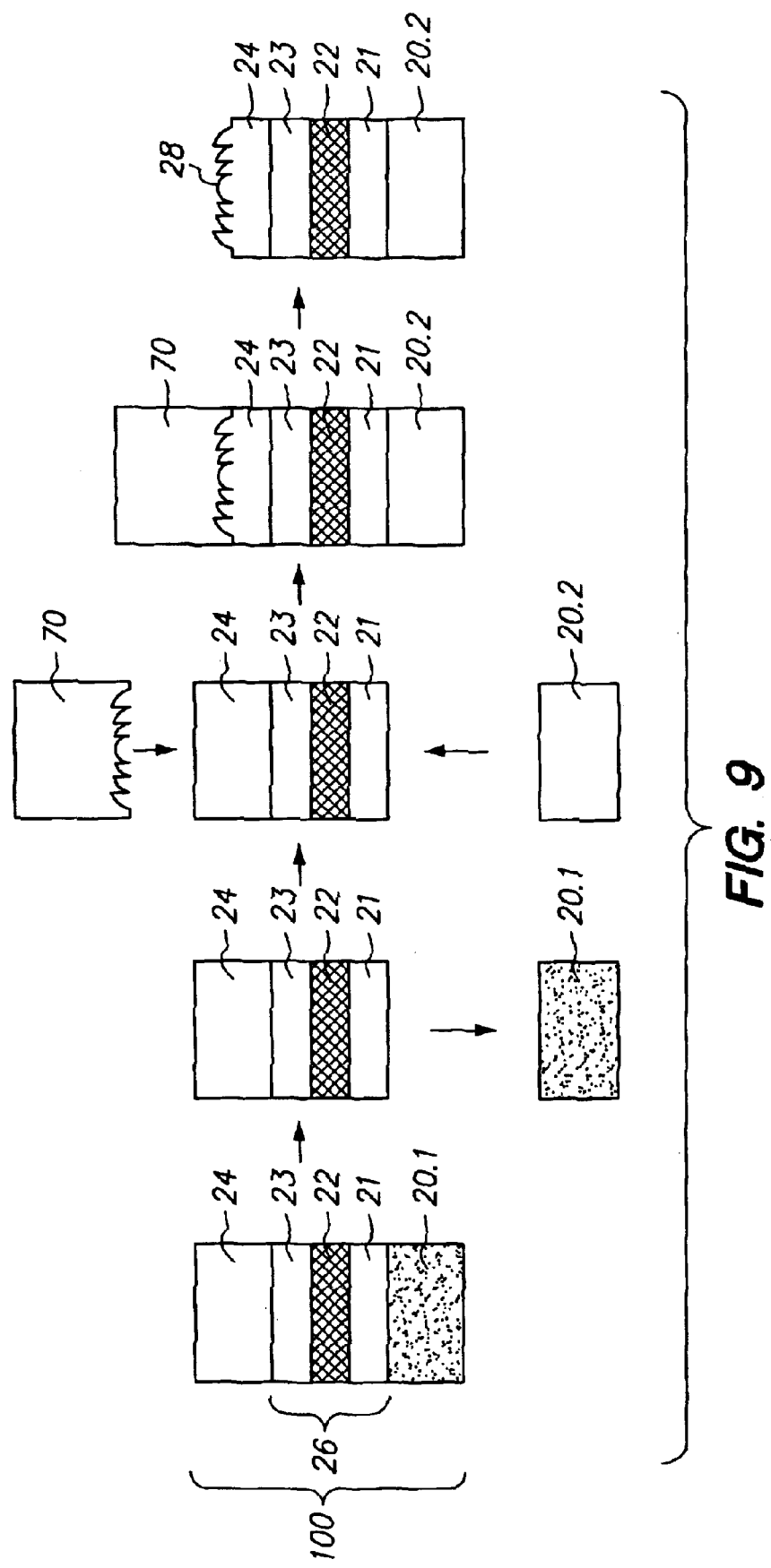
FIG. 9 is a schematic diagram depicting an exemplary integration of the stamping process and the wafer-bonding process.

In the exemplary process illustrated in FIG. 9, top layer 24 is stamped with stamping block 70 that has a pattern inverse of the pattern of optical element 28. FIG. 9 shows optical element 28 as Fresnel lens 28. This stamping method can be used to form optical lens 28 on any surface of semiconductor light emitter 100. Although FIG. 9 shows a wafer-bonding process executed concurrently with stamping, it is to be understood that stamping can be done before or after wafer-bonding, or as a completely separate and independent process. For example, an optical element may be stamped on semiconductor light emitter 100 that is not wafer bonded. Alternatively, optical element can be first stamped on a material that is later bonded to semiconductor light emitter 100.

The stamping method increases the likelihood that the index of refraction of Fresnel lens 28 will match the index of refraction of top layer 24 of the LED, as it is top layer 24 of the LED that is formed into Fresnel lens 28. During the stamping process, semiconductor light emitter 100 is heated to at least the ductile transition point of top layer 24, and pressed with stamping block 70. If necessary, a pressure equal to or greater than 100 psi may be applied to facilitate the stamping (the exact pressure depends on the material being used and the process temperature). After top layer 24 of semiconductor light emitter 100 has been stamped, the pressure can be released and the temperature can be lowered in order to facilitate the separation of stamping block 70 from the resultant light emitting device. The stamping block material must be able to withstand the applied temperature and pressure in order to stamp a precise Fresnel lens pattern on semiconductor light emitter 100. Thus, the stamping block material is likely to have a ductile transition point higher than the ductile transition point of the material (e.g., semiconductor material) that makes the surface to be stamped. Some examples of materials that may be suitable as stamping blocks (depending on the choice of the surface material) include molybdenum alloys such as TZM (an alloy of molybdenum, titanium, zirconium, and carbon), graphite, silicon carbide, sapphire, stainless steel, Hastalloy®, Kovar®, Nichrome®, tungsten and tungsten alloys, tantalum, columbium, and titanium alloys.

Unlike the bonding process, which is usually a separate step in the production process, stamping may optionally be executed concurrently with wafer-bonding (see FIG. 9), or executed separately before or after the wafer-bonding process. The objective of the wafer-bonding process is to improve light extraction by first removing original substrate 20.1, which is usually absorptive, then replacing it with new substrate 20.2 that allows more light to reach the external environment. Original substrate 20.1 is a material compatible with fabricating semiconductor light emitter layers having desired mechanical characteristics. For example, in order to achieve high quality epitaxial growth and to ensure lattice matching, standard absorbing substrate materials may be utilized. These absorbing growth substrates typically have an energy gap that is less than or equal to the emission energy of the semiconductor light emitter. After the growth of the multi-layered structure 26, original substrate 20.1 is removed. Original substrate 20.1 may be removed by methods including but not limited to chemical etching and lapping/polishing.

Subsequent to the removal of the original substrate 20.1, a second substrate 20.2, which is optically transparent, is bonded to semiconductor light emitter 100. The bonding procedure involves heating new substrate 20.2 to a temperature between 25° and 1000° C. depending on the composition of new substrate 20.2. Further details on wafer-bonding process are described in U.S. Pat. No. 5,502,316 to Fred A. Kish, et. al., entitled, "Wafer Bonding of Light Emitting Diode Layers", which is herein incorporated by reference. The stamping process can be incorporated into the wafer-bonding process by pressing both new substrate 20.2 and stamping block 70 onto semiconductor light emitter 100 at once, as shown in FIG. 9. Stamping block 70 can press Fresnel lens 28 into new substrate 20.2, top layer 24 (superstrate), or both. Stamping block 70 can contain patterns for more than one optical element, although FIG. 9 shows only one optical element for clarity and convenience.

Figure 10:
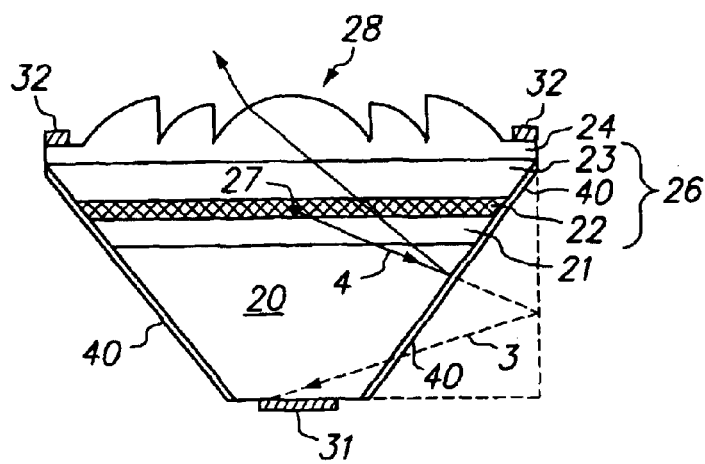
FIG. 10 is a schematic diagram of a Fresnel lens formed on a surface of an LED with beveled sides.

FIG. 10 shows semiconductor light emitter 100 with beveled sides. Beveling the sides improves light extraction by altering the angle at which photons are reflected, as shown by the difference in path 3 and path 4. When the sides are beveled, photons emitted by active layer 22 can travel along path 4 (solid line) instead of path 3. Path 3 is the path taken in a semiconductor light emitter with non-beveled sides (see FIG. 7A). Path 3, shown with broken lines in FIG. 10, illustrates that when the sides are not beveled, a photon emitted from spot 27 of active layer 22 would have reflected off a side and been absorbed by contact 31. However, path 4, shown with a solid line in FIG. 10, illustrates that a photon from point source 27 that is emitted in the same direction in a beveled light emitting device is reflected toward Fresnel lens 28 and escapes the light emitting device. Thus, beveled sides improve the light extraction efficiency by directing to the extraction surface some of the photons that would otherwise not have escaped the light emitting device. The light extraction will be even more improved if the beveled sides are coated with a reflective material 40, such as a metal (e.g., silver) or a dielectric, to further minimize absorption.

Figure 11:
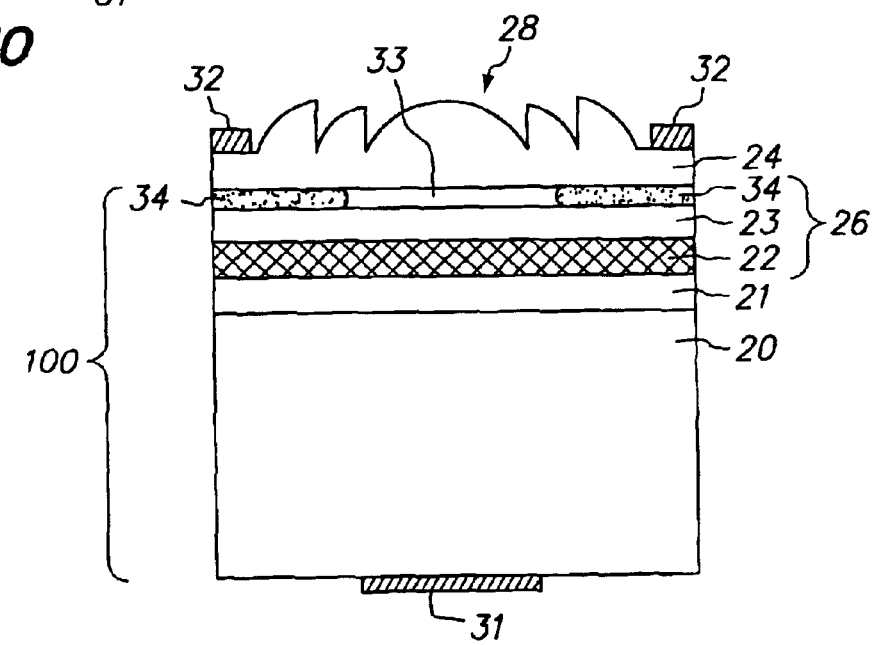
FIG. 11 is a schematic diagram of a Fresnel lens formed on a confined-emission spot LED with anisotropic native oxide formation.

FIG. 11 shows a light emitting device which includes semiconductor light emitter 100 with active layer 22 that has a cross sectional area smaller than the cross sectional area of Fresnel lens 28. As used herein, cross sectional area is in a plane parallel to the interface of different layers of semiconductor light emitter 100. An aperture or a guard ring can be used to block the current from the edges of the active layer. Alternatively, ion implantation or diffusion can be used to block or channel the current away from the edges of active layer 22. Selective area growth and selective area bonding, which are also referred to as patterned wafer bonding and patterned epitaxial growth, are two additional methods of confining light emission. Selective area growth and selective area bonding are discussed in detail in U.S. Pat. No. 5,793,062, which is incorporated by reference above. Furthermore, a confined-emission spot LED can be created by passivating the edges of active layer 22 via oxide formation. A confined-emission spot LED, such as the one depicted in FIG. 11, is created using the Holonyak process. The Holonyak process entails forming mesa 33 by subjecting the LED device to a temperature between 375° C. and 550° C. for up to three hours. During the Holonyak process, which is performed to prevent the formation of undesirable aluminum oxides, electrically insulative native oxides 34 are formed on top of a confining layer 23. Details of the Holonyak process and applications can be found in U.S. Pat. No. 5,262,360 to Nick Holonyak, Jr. et al. entitled "AlGaAs Native Oxide" and U.S. Pat. No. 5,517,039 to Nick Holonyak Jr. et al, entitled "Semiconductor Devices Fabricated with Passivated High-Aluminum III-V Material". Both patents are herein incorporated by reference.

In the confined-emission spot LED depicted in FIG. 11, top layer 24 may be, but is not limited to, an aluminum-bearing p-type conductive layer. Mesa 33 may be an aluminum-bearing transparent p-type layer. The composition of the conductive layer (which is made of, for example, a high aluminum-content III-V semiconductor) is chosen to have a higher aluminum mole fraction so that the lateral oxidation rate of the conductive layer is much faster than the bulk oxidation rate of top layer 24 or, if the particular LED 100 has no separate top layer 24, upper confining layer 23. FIG. 11 depicts an LED device with its aluminum-bearing layer exposed. An anisotropic oxidation of the aluminum-bearing layer results in the formation of mesa 33 and native oxides 34. The insulating properties of native oxides 34 restrict current flow in those regions, thus producing a confined-emission spot LED. Top layer 24, which is an aluminum-bearing p-type conductive layer in the present example and mesa 33 could be formed from any transparent aluminum-bearing compounds that possess the proper anisotropy in their respective oxidation rates.

Figure 12:
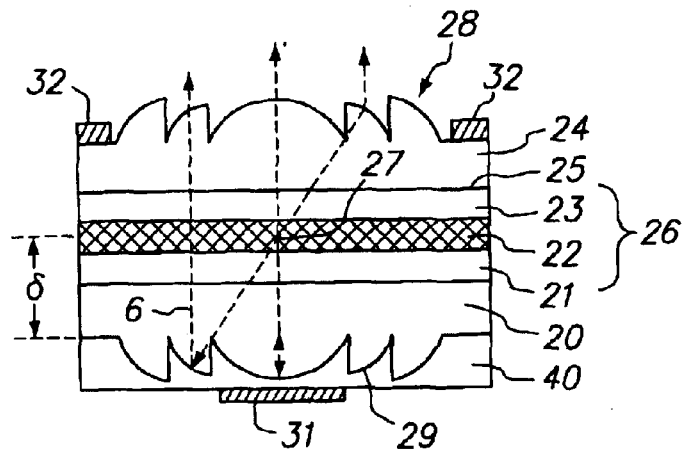
FIG. 12 is a schematic diagram of a light emitting device with light-collimating Fresnel lenses formed on two opposing surfaces of a semiconductor light emitter, wherein one lens is coated with a reflective material.
Figure 13:
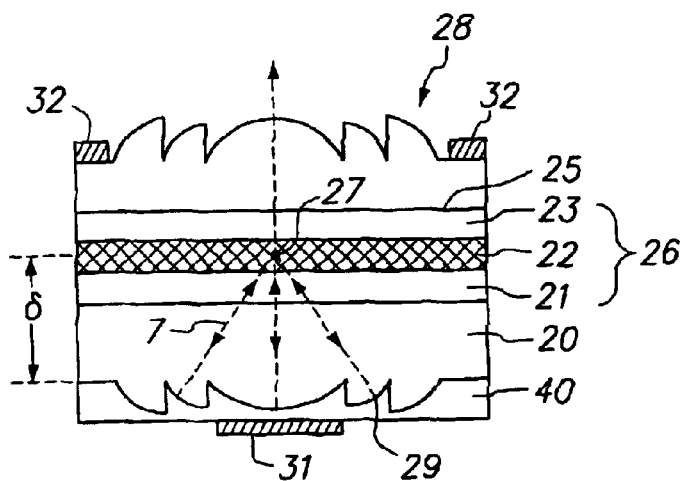
FIG. 13 is a schematic diagram of a light emitting device with two Fresnel lenses formed on opposing surfaces of a semiconductor light emitter, wherein the lens coated with a reflective material focuses light onto the active layer.

FIG. 12 and FIG. 13 depict embodiments of the present invention that contain two optical elements 28, 29, one of which may be coated with reflective material 40 to form a reflector. FIG. 12 shows optical element 29 as reflector 29 placed on a surface opposite of the surface having Fresnel lens 28. The grooves of both Fresnel lens 28 and reflector 29 are patterned to collimate incident light rays. Thus, when photons emitted from point source 27 travel along the path depicted with broken lines and strike reflector 29, reflector 29 collimates and reflects the photons back up towards Fresnel lens 28. Without reflector 29, photons emitted from point source 27 would travel along path 5 shown in FIG. 7A, and might fail to leave the light emitting device. The photons following path 5 may be internally reflected a number of times and become absorbed, attenuated, or extracted by a surface that is not an extraction surface.

FIG. 13, like FIG. 12, shows Fresnel lens 28 on one surface of a light emitting device and reflector 29 on the opposite surface. However, the grooves of reflector 29 in FIG. 13 focus the incident photons onto point source 27 instead of collimating the photons, as in FIG. 12. The light emitting device of FIG. 13 increases the on-axis intensity of the light that is extracted by making a photon that would have traveled along path 6 in FIG. 12 travel along path 7 in FIG. 13. Reflector 29 of FIG. 13 may be made to collimate, focus, diverge, or direct the incident photons back towards Fresnel lens 28 by adjusting one or more of distance δ, the horizontal placement of reflector 29, and the pattern of the grooves. Similarly, photons can be directed away from the absorbing areas within the LED, such as active layer 22 and contacts 31 and 32. A person of ordinary skill in the art would be able to design the Fresnel lens(es) and tailor a desired radiation pattern to suit a particular application. For example, the embodiment in FIG. 13 may be preferable to the embodiment in FIG. 12 for applications that require a high on-axis-intensity.

Figure 14:
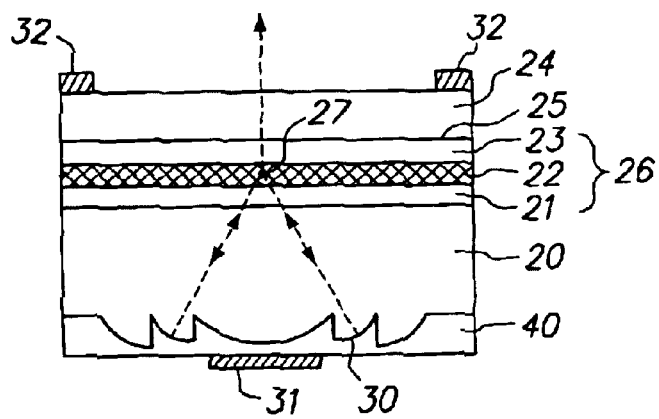
FIG. 14 is a schematic diagram of a light-focusing Fresnel lens formed on a surface of a semiconductor light emitter that is not an extraction surface to increase the on-axis intensity.
Figure 15:
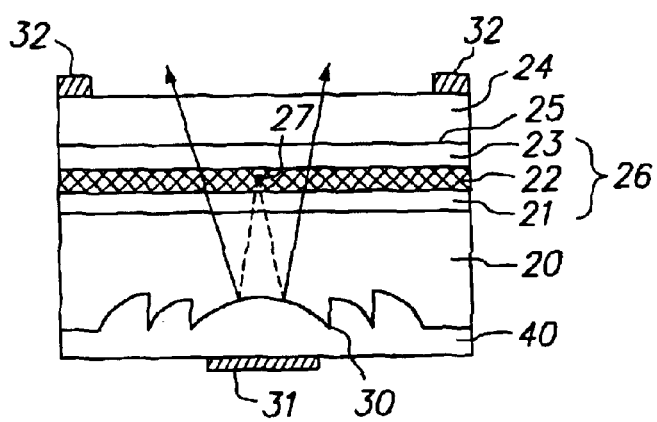
FIG. 15 is a schematic diagram of a divergent Fresnel lens formed on a surface of a semiconductor light emitter that is not an extraction surface and coated with a reflective material.

As depicted in FIG. 14 and FIG. 15, the present invention does not require an optical element at the extraction surface. Photons emitted from point source 27 are focused in FIG. 14 and diverged in FIG. 15. In both cases, the photons are reflected up toward the extraction surface. The embodiment in FIG. 14, which produces a high on-axis intensity like the embodiment in FIG. 13, could be useful for applications requiring a high on-axis intensity source, such as fiber optics applications.

Figure 16:
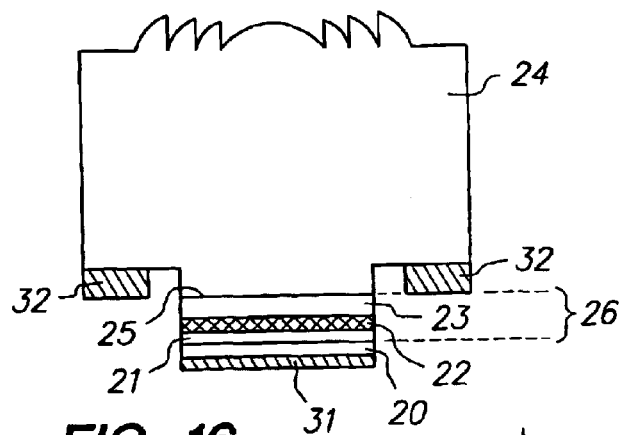
FIG. 16 is a schematic diagram of a light emitting device in a flip-chip configuration.

FIG. 16 depicts a light emitting device that uses a flip-chip configuration. The flip-chip configuration allows both contacts 31, 32 to be placed on one side, in this case on the bottom side. As contacts 31 and 32 are frequently absorbing and occupy a part of the light extraction surface, their removal from the light extraction surface allows more light to escape the LED device through the extraction surface.

Figure 17:
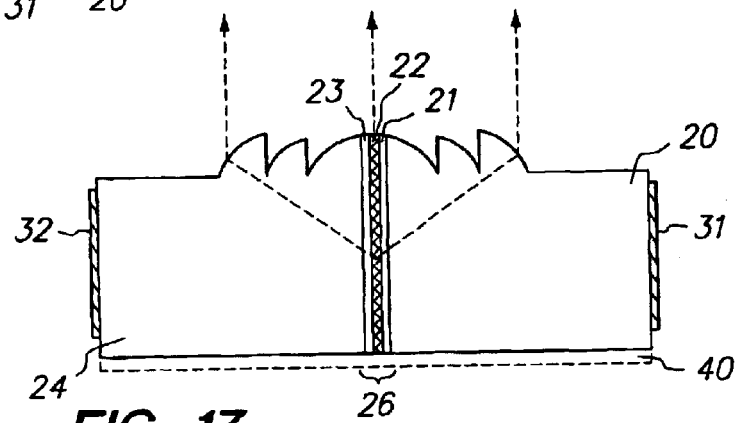
FIG. 17 is a schematic diagram of a light emitting device having an active layer that is substantially perpendicular to the Fresnel lens.

FIG. 17 depicts a light emitting device in which the orientation of confining layers 21, 23 and active layer 22 are substantially perpendicular to the extraction surface. The light emitting device shown in FIG. 17 is semiconductor light emitter 100 of FIG. 1 that is rotated ninety degrees so that the light is extracted from the side of semiconductor light emitter 100. Like the flip-chip configuration, the configuration shown in FIG. 17 has the advantage of not having any contacts on the extraction surface.

Figure 18:
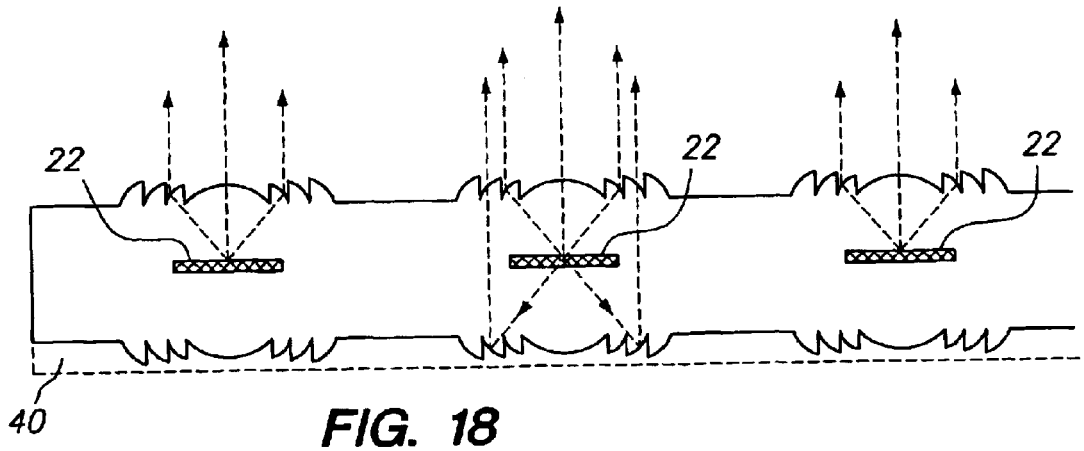
FIG. 18 is a schematic diagram of a diode array on a single substrate.
Figure 19:
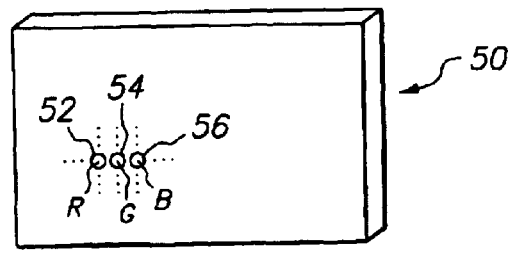
FIG. 19 is a schematic diagram of a display device incorporating the light emitting device according to the present invention.

Multiple LEDs of the present invention can be used together for a high power application. For example, FIG. 18 shows three light emitting devices of the type depicted in FIG. 13 arranged in an array to emit a high light output. These diode arrays, which may be formed on one LED chip or wafer, typically have an area much larger than a single chip of a semiconductor light emitter. Also, the LED device of the present invention is suitable for color display panels using red, green, and blue LEDs as pixel elements. Such displays are well known and are represented in FIG. 19. A display panel 50 has an array of light emitting devices including red (52), green (54), and blue (56) LEDs, respectively, that are selectively illuminated by well known circuitry to display an image. Only three pixels are shown in FIG. 19 for simplicity. In one embodiment, the light emitting devices are arranged in columns. In other embodiments, the light emitting devices are arranged in other patterns, such as triangles. The high-light-extraction light emitting devices may also be used for backlighting an LCD display.

While the present invention is illustrated with particular embodiments, it is not intended that the scope of the invention be limited to the specific and preferred embodiments illustrated and described. For example, devices such as photodetectors and solar cells would benefit from the embodiments disclosed herein.

What is claimed is:

1. A method of forming a light emitting device, said method comprising:

forming at least one of Fresnel lens and holographic diffuser on at least one surface of a semiconductor light emitter to affect light emitted by said semiconductor light emitter;

wherein the at least one surface is one of an alloy comprising $(Al_xGa_{1-x})_yIn_{1-y}P$ where $0 \leq x \leq 1$ and $0 \leq y \leq 1$ and a III-nitride alloy.

2. The method of claim 1 wherein said semiconductor light emitter has at least one light extraction surface from where light is intended to be extracted, and wherein said forming is done on at least one extraction surface of said semiconductor light emitter.

3. The method of claim 2 further comprising:

forming an optical element on the surface opposite of said extraction surface.

4. The method of claim 1 wherein said forming is executed concurrently with a wafer-bonding process, said wafer-bonding process comprising:

removing a first substrate of said semiconductor light emitter; and bonding a second substrate to said semiconductor light emitter.

5. The method of claim 1 further comprising:

beveling one or more sides of said semiconductor light emitter.

6. The method of claim 1 wherein said semiconductor light emitter has a light emitting layer, the method further comprising:

confining light emission to a preselected section of said light emitting layer.

7. The method of claim 1 wherein said semiconductor light emitter has a tight emitting layer, the method further comprising confining light emission to a preselected section of said light emitting layer, wherein said confining comprises at least one method selected from applying the Holonyak process, using selective area growth, using selective area bonding, using diffusion, and using ion implantation.

8. The method of claim 1 further comprising:

coating one or more surfaces of said semiconductor light emitter with a reflective material.

9. The method of claim 1 further comprising:

coating said Fresnel lens or said holographic diffuser with a reflective material.

10. The method of claim 1 wherein said forming comprises pressing a stamping block against at least one surface of said semiconductor light emitter, the stamping block comprising a material selected from the group of molybdenum, titanium, zirconium, graphite, silicon carbide, sapphire, stainless steel, tungsten, tantalum, columbium, and alloys thereof.

11. A method of forming a light emitting device, said method comprising:

forming at least one of Fresnel lens and holographic diffuser on at least one surface of a semiconductor light emitter to affect light emitted by said semiconductor light emitter;

wherein said forming comprises at least one method selected from ablation, machining, scribing, and electron discharge machining; and wherein the at least one surface is one of an alloy comprising $(Al_xGa_{1-x})_yIn_{1-y}P$ where $0 \leq x \leq 1$ and $0 \leq y \leq 1$ and a III-nitride alloy.

12. A light emitting device comprising:

a semiconductor light emitter; and a first optical element stamped on at least one surface of said semiconductor light emitter, said first optical element comprising one of Fresnel lens and holographic diffuser;

wherein the stamped surface is one of an alloy comprising $(Al_xGa_{1-x})_yIn_{1-y}P$ where $0 \leq x \leq 1$ and $0 \leq y \leq 1$ and a III-nitride alloy.

13. The device of claim 12 further comprising:

a reflective material coating at least one surface of said device.

14. The device of claim 12 wherein a light emitting layer of said semiconductor light emitter is made to emit photons primarily towards a preselected section of said first optical element.

15. The device of claim 12 wherein at least one surface of light emitting device is beveled.

16. The device of claim 12 wherein said semiconductor light emitter is a confined-emission spot light emitting diode.

17. The device of claim 12 wherein said semiconductor light emitter and said first optical element comprise $(Al_xGa_{1-x})_yIn_{1-y}P$ where $0 \leq x \leq 1$ and $0 \leq y \leq 1$.

18. The device of claim 12 wherein said light-emitting diode comprises a III-nitride semiconductor alloy and said first optical element comprises one of silicon carbide and sapphire.

19. The device of claim 18, wherein said semiconductor light emitter has a flip-chip configuration.

20. The device of claim 12 wherein said semiconductor light emitter and said first optical element comprise aluminum gallium arsenide semiconductor alloy.

21. The device of claim 12, wherein said semiconductor light emitter has a flip-chip configuration.

22. The device of claim 12, wherein said semiconductor light emitter has a configuration in which a light emitting layer of said semiconductor light emitter is substantially perpendicular to said Fresnel lens.

23. The device of claim 12, wherein the radiation pattern of said device is controlled by the ratio of the focal length of said first optical element to the distance between said first optical element and a light-emitting layer of said semiconductor light emitter.

24. The device of claim 12, wherein said first optical element is designed to achieve one of light focusing, light collimating, and light diverging.

25. The device of claim 12 wherein said first optical element is designed to direct light in a preselected direction.

26. The device of claim 12 further comprising:
a second optical element on a surface of said semiconductor light emitter opposite the surface having said first optical element.

27. The device of claim 26 wherein at least one of said first Fresnel lens and said second Fresnel lens is designed to focus light.

28. A method of forming a light emitting device, said method comprising:
stamping at least one optical element on at least one surface of a semiconductor light emitter to affect the light emitted by said semiconductor light emitter
wherein the stamped surface is one of an alloy comprising $(Al_xGa_{1-x})_yIn_{1-y}P$ where $0 \leq x \leq 1$ and $0 \leq y \leq 1$ and a III-nitride alloy.

29. The method of claim 28 further comprising:
coating a surface of said light emitting device with a reflective layer.

30. The method of claim 28 wherein said stamping is done on at least one of a semiconductor layer and a substrate layer of said semiconductor light emitter.

31. The method of claim 30 wherein said semiconductor layer comprises a transparent aluminum-bearing compound.

32. The method of claim 28, wherein said stamping is executed at an elevated temperature, said elevated temperature being higher than room temperature.

33. The method of claim 32, further comprising lowering said elevated temperature to facilitate the separation of a stamping block from said semiconductor light emitter after said stamping.

34. The method of claim 33, wherein said elevated temperature is higher than the ductile transition temperature of the material constituting said at least one surface on which said optical element is formed.

35. The method of claim 28 wherein stamping comprises using a stamping block comprising a material selected from the group of molybdenum, titanium, zirconium, graphite, silicon carbide, sapphire, stainless steel, tungsten, tantalum, columbium, and alloys thereof.

36. A light emitting device comprising:
a semiconductor light emitter; and
at least one optical element stamped on at least one surface of said semiconductor light emitter, wherein said optical element is a first optical element;
wherein the stamped surface is one of an alloy comprising $(Al_xGa_{1-x})_yIn_{1-y}P$ where $0 \leq x \leq 1$ and $0 \leq y \leq 1$ and a III-nitride alloy.

37. The device of claim 36 wherein a light emitting layer of said semiconductor light emitter is made to emit photons primarily toward a preselected section of said first optical element.

38. The device of claim 36 wherein said light-emitting and said first optical element comprise $(Al_xGa_{1-x})_yIn_{1-y}P$ where $0 \leq x \leq 1$ and $0 \leq y \leq 1$.

39. The device of claim 36 wherein said semiconductor light emitter comprises a III-nitride semiconductor alloy and said first optical element comprises one of silicon carbide and sapphire.

40. The device of claim 39, wherein said semiconductor light emitter has a flip-chip configuration.

41. The device of claim 36 wherein said semiconductor light emitter and said first optical element comprise aluminum gallium arsenide semiconductor alloy.

42. The device of claim 36 wherein said light emitting diode has a flip-chip configuration.

43. The device of claim 36 wherein said light emitting diode has a configuration in which the light emitting layer of said light emitting diode is substantially perpendicular to said Fresnel lens.

44. A light emitting diode array comprising a plurality of light emitting devices, a light emitting device comprising:
a semiconductor light emitter; and
one of a Fresnel lens and a holographic diffuser stamped on a surface of said semiconductor light emitter;
wherein the stamped surface is one of an alloy comprising $(Al_xGa_{1-x})_yIn_{1-y}P$ where $0 \leq x \leq 1$ and $0 \leq y \leq 1$ and a III-nitride alloy.

45. A light emitting array comprising a plurality of light emitting devices, a light emitting device comprising:
a semiconductor light emitter; and
an optical element stamped on a surface of said semiconductor light emitter;
wherein the stamped surface is one of an alloy comprising $(Al_xGa_{1-x})_yIn_{1-y}P$ where $0 \leq x \leq 1$ and $0 \leq y \leq 1$ and a III-nitride alloy.

46. A display device comprising at least one blue light emitting device, at least one green light emitting device, and at least one red light emitting device, wherein at least one of said blue light emitting device, green light emitting device, and red light emitting device comprises:
a semiconductor light emitter; and
one of a Fresnel lens and a holographic diffuser stamped on a surface of said semiconductor light emitter;
wherein the stamped surface is one of an alloy comprising $(Al_xGa_{1-x})_yIn_{1-y}P$ where $0 \leq x \leq 1$ and $0 \leq y \leq 1$ and a III-nitride alloy.

47. A display device comprising at least one blue light emitting device, at least one green light emitting device, and at least one red light emitting device, wherein at least one of said blue light emitting device, green light emitting device, and red light emitting device comprises:
a semiconductor light emitter; and
one optical element stamped on a surface of said semiconductor light emitter;
wherein the stamped surface is one of an alloy comprising $(Al_xGa_{1-x})_yIn_{1-y}P$ where $0 \leq x \leq 1$ and $0 \leq y \leq 1$ and a III-nitride alloy.

48. A method for forming a light emitting device, said method comprising:
stamping an optical element in a material, said material being transparent to light emitted from said light emitting device, said material being one of high index optical glass, III-V semiconductors, II-VI semiconductors, group IV semiconductors, high-index organic semiconductors, high index organic compounds, and mixtures or alloys thereof; and bonding said material to a semiconductor light emitter, the bond being formed at an interface between the material and a surface of the semiconductor light emitter from which light exits the emitter.

49. The method of claim 48, wherein said stamping precedes said bonding.

50. The method of claim 48, wherein said bonding precedes said stamping.

51. The method of claim 48, wherein bonding comprises bonding said material to a semiconductor light emitter with a bonding material, said bonding material being one of high index optical glass, III-V semiconductors, II-VI semiconductors, group IV semiconductors, high-index organic semiconductors, high index organic compounds, mixtures or alloys thereof.

52. The method of claim 48, wherein bonding comprises pressing said material together with said semiconductor light emitter at a temperature greater than room temperature.

53. A light emitting device comprising:

a semiconductor light emitter; and an optical element stamped on a material transparent to light emitted from said light emitting device, said material being one of high index optical glass, III-V semiconductors, II-VI semiconductors, group IV semiconductors, high-index organic semiconductors, high index organic compounds, and mixtures or alloys thereof;

wherein said material is bonded to said semiconductor light emitter, the bond being formed at an interface between the material and a surface of the semiconductor light emitter from which light exits the emitter.

* * * * *

UNITED STATES PATENT AND TRADEMARK OFFICE
CERTIFICATE OF CORRECTION

| | | |
|---|---|---|
| PATENT NO. | : 6,987,613 B2 | Page 1 of 1 |
| APPLICATION NO. | : 09/823841 | |
| DATED | : January 17, 2006 | |
| INVENTOR(S) | : Douglas W. Pocius, Michael D. Camras and Gloria E. Hofler | |

It is certified that error appears in the above-identified patent and that said Letters Patent is hereby corrected as shown below:

Column 12, line 12, claim 7: Cancel "tight" and substitute

--light--.

Column 13, line 31, claim 27: Cancel "Fresnel lens and said second Fresnel lens" and substitute --optical element and said second optical element--.

Signed and Sealed this

Thirtieth Day of January, 2007

JON W. DUDAS
*Director of the United States Patent and Trademark Office*